United States Patent [19]
Datsikas

[11] Patent Number: 5,992,006
[45] Date of Patent: Nov. 30, 1999

[54] METHOD FOR PASSIVE CONTROL OF MAGNET HEMOGENEITY

[75] Inventor: Thomas Datsikas, Melville, N.Y.

[73] Assignee: Fonar Corporation, Melville, N.Y.

[21] Appl. No.: 09/219,489

[22] Filed: Dec. 23, 1998

[51] Int. Cl.$^6$ .................................................. H01F 41/02
[52] U.S. Cl. ............................................. 29/607; 335/302
[58] Field of Search ........................... 29/607, 608, 609; 335/302–306

[56] References Cited

U.S. PATENT DOCUMENTS

| | | | |
|---|---|---|---|
| 4,023,263 | 5/1977 | Postma | 29/607 |
| 5,539,368 | 7/1996 | Yamashita | 29/607 X |

*Primary Examiner*—Carl E. Hall
*Attorney, Agent, or Firm*—Rabin & Champagne, P.C.

[57] ABSTRACT

A method and apparatus for passively shimming a magnet. A magnetic field produced by the magnet is measured and modeled in the form of a Legendre polynomial expansion having a predetermined number of harmonic terms. The degree of non-homogeneity in the measured field is determined by examining the harmonic terms. A shim is then designed to correspond to a magnitude change of a harmonic term of the polynomial expansion in order to improve the homogeneity of the magnetic field. A metal plate is connected to or placed near a pole of the magnet, the shim is placed against the metal plate, and a plastic plate is attached to the metal plate such that the shim is held in place in a predetermined location against the metal plate.

21 Claims, 4 Drawing Sheets

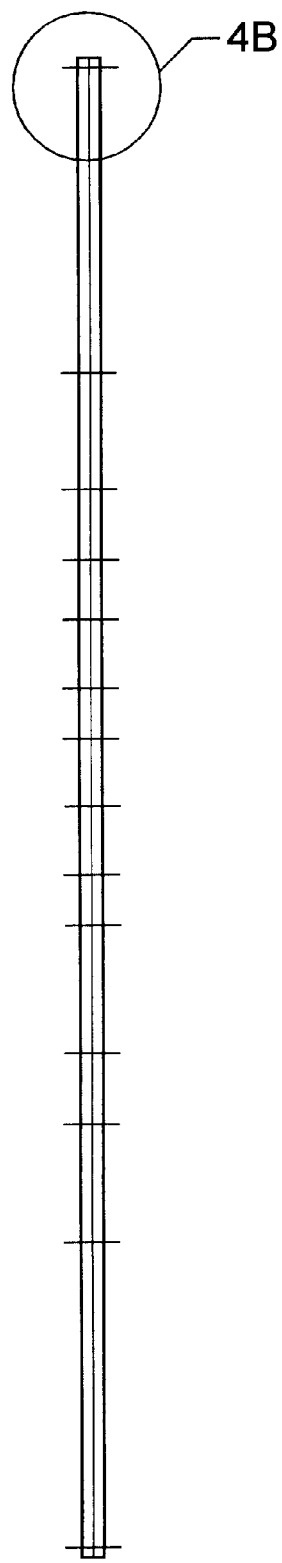
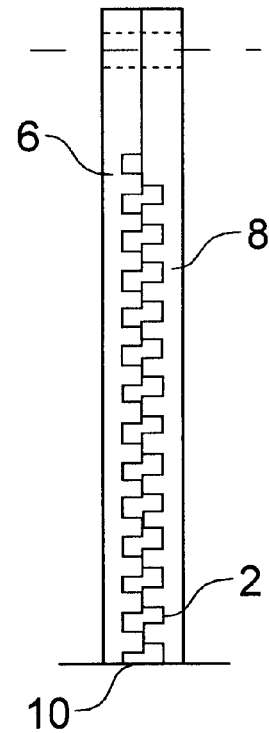
FIG. 4B
FIG. 4A

METHOD FOR PASSIVE CONTROL OF MAGNET HEMOGENEITY

FIELD OF THE INVENTION

In general, the present invention relates to a method and apparatus for shimming a magnet. In particular, the present invention is a method for determining the placement of shim elements, and an apparatus used to place the shim elements in specific locations on the pole surface of a magnet in order to shape the magnetic field to achieve greater uniformity.

BACKGROUND OF THE INVENTION

Magnetic resonance imaging ("MRI") is one of the most versatile and fastest growing modalities in medical imaging. As part of the MRI process, the subject patient is placed in an external magnetic field. This field is created by a magnet assembly, which may be closed or open. Open magnet assemblies have two spaced-apart magnet poles separated by a gap, and a working magnetic field volume located within the gap.

The diagnostic quality of images produced by MRI is directly related to several system performance characteristics. One very important consideration is the uniformity, or homogeneity, of the main magnetic field. In order to produce high-resolution images, the magnetic field produced in the MRI scanner must be maintained to a very high degree of uniformity. However, an MRI magnet initially produces a field that is usually less uniform than that required to image successfully. At some point after manufacture, the magnet assembly must be adjusted to produce a more uniform field.

A process known as shimming is used to improve the homogeneity of the magnetic field to the necessary levels by making small mechanical and/or electrical adjustments to the overall field. Mechanical adjustments are called passive shimming, while electrical adjustments are known as active shimming. Electrical adjustments are effective because electrical current passing through a wire will produce a magnetic field around that wire. When these wires are formed into coils, the strength, direction, and shape of the magnetic field produced can be controlled by adjusting the physical and electrical parameters of the coils. Placing these coils in strategic locations as secondary magnetic field sources has the effect of adding to or subtracting from the main magnetic field in localized regions as well as over the entire pole surface, affecting the overall homogeneity of the main field. While the use of these "shim coils" has allowed the homogeneity of the main MRI magnetic field to be greatly improved, there are numerous drawbacks associated with their use.

For example, the electric current in the shim coils may be unstable, resulting in an overall instability in the main magnetic field. This instability may cause "ghosting" in the MR images. Ghosting is an interference phenomenon that appears at periodic intervals along the phase axis. These errors are unacceptable to any radiologist, who may confuse the correct position of the patient's anatomic elements, possibly resulting in an incorrect diagnosis.

Further, shim coils are temperature sensitive. Variations in the temperature of the individual coils can cause instabilities in the main magnetic field, resulting in image artifacts. In addition, the currents used to produce the magnetic fields in the shim coils require complicated electronic circuits, such as voltage and current regulators and current amplifiers, to maintain stability. The shim coil can become inoperable when one or more of these electronic components breaks or goes out of tolerance. Even when all the electronic components are working properly, this type of active shimming adds expense and complexity to the overall MRI system. Passive shimming avoids adding complexity to the MRI system, but instead makes manufacture of the magnets more complicated, usually by requiring the custom physical modification of the magnet core components, such as shim bars, while adjusting the uniformity of the field produced by the newly-manufactured magnet.

SUMMARY OF THE INVENTION

To overcome these and other shortcomings of the active (coil) shimming process, the present invention eliminates or minimizes the use of some or all shim coils and their associated currents altogether, achieving a high degree of field uniformity required for high resolution imaging through a process using only passive shimming. The shimming is effected through the use of metal shim elements which are added to the standard magnet in order to physically influence the overall field produced by the magnet. The shim elements may be held in place by a non-metallic cover which is affixed to the magnet. Preferably, a metal plate may be applied between the magnet and the non-metallic cover to incorporate a combination of shim elements in the form of additive metal elements, and other shim elements in the form of areas where metal has been removed from the metal plate.

According to a first aspect of the present invention, a method for passively shimming a magnet includes measuring a magnetic field produced within a predetermined volume by the magnet, modeling the measured magnetic field in the form of a polynomial expansion having a predetermined number of harmonic terms, detecting the degree of homogeneity in the measured field within the predetermined volume by examining the harmonic terms, determining which harmonic term of the polynomial expansion should be modified in order to change the homogeneity detected in the measured field, and designing a metal element which would provide the determined harmonic term modification when coupled to the magnet. Magnetic field data is produced during measurement, and this data is analyzed and described as the polynomial expansion during the modeling. Preferably, the polynomial expansion is a Legendre expansion, and the metal element is a shim. The shim may be a metal ring or an arcuate metal element, and is coupled to a pole of the magnet assembly. The method may also include attaching a non-metallic cover plate to the magnet, wherein the cover plate includes grooved portions for holding the shim in place in a predetermined location with respect to the pole of the magnet assembly. The method may further include disposing a metal plate such that the metal plate affects the magnetic field produced by the magnet, and such that the shim is held in the predetermined location between the metal plate and the cover plate. The method may also include removing a portion of the magnet or the metal plate corresponding to the metal element in order to modify the determined harmonic term.

According to another aspect of the invention, an apparatus for changing a homogeneity of a magnetic field produced by a magnet includes a first plate for placement near enough to the pole of the magnet so as to have an effect on the magnetic field, a shim for placement near enough to the first plate so as to have an effect on the magnetic field, and a second plate for attachment to the first plate such that the shim is held in place in a predetermined location between the first plate and the second plate. The second plate includes means for holding the shim in the predetermined location, preferably a grooved surface. Preferably, the first plate is made substantially of metal and the second plate is made of a non-metallic material. The shim is made substantially of metal, and may be a metal ring or an arcuate metal element. The shim corresponds to a magnitude change of a harmonic term of a polynomial expansion describing the magnetic field in order to change the homogeneity of the magnetic field, and the first plate may include a grooved portion which corresponds to a magnitude change of a harmonic term of a polynomial expansion describing the magnetic field in order to change the homogeneity of the magnetic field.

According to a further aspect of the present invention, an apparatus for changing a homogeneity of a magnetic field produced by a magnet includes a shim and a plate for attachment to the magnet such that the shim is held in place in a predetermined location between the magnet and the plate. The plate includes means for holding the shim in the predetermined location, preferably a grooved surface. The plate is made of a non-metallic material. The shim is made substantially of metal, and may be a metal ring or an arcuate metal element. The shim corresponds to a magnitude change of a harmonic term of a polynomial expansion describing the magnetic field in order to change the homogeneity of the magnetic field. The apparatus may include a grooved portion in the magnet which corresponds to a magnitude change of a harmonic term of a polynomial expansion describing the magnetic field in order to change the homogeneity of the magnetic field.

BRIEF DESCRIPTION OF THE DRAWINGS

FIGS. 4(a) and 4(b) show an exemplary metal/non-metal shim plate construction of the present invention.

DETAILED DESCRIPTION OF THE INVENTION

Figure 1:
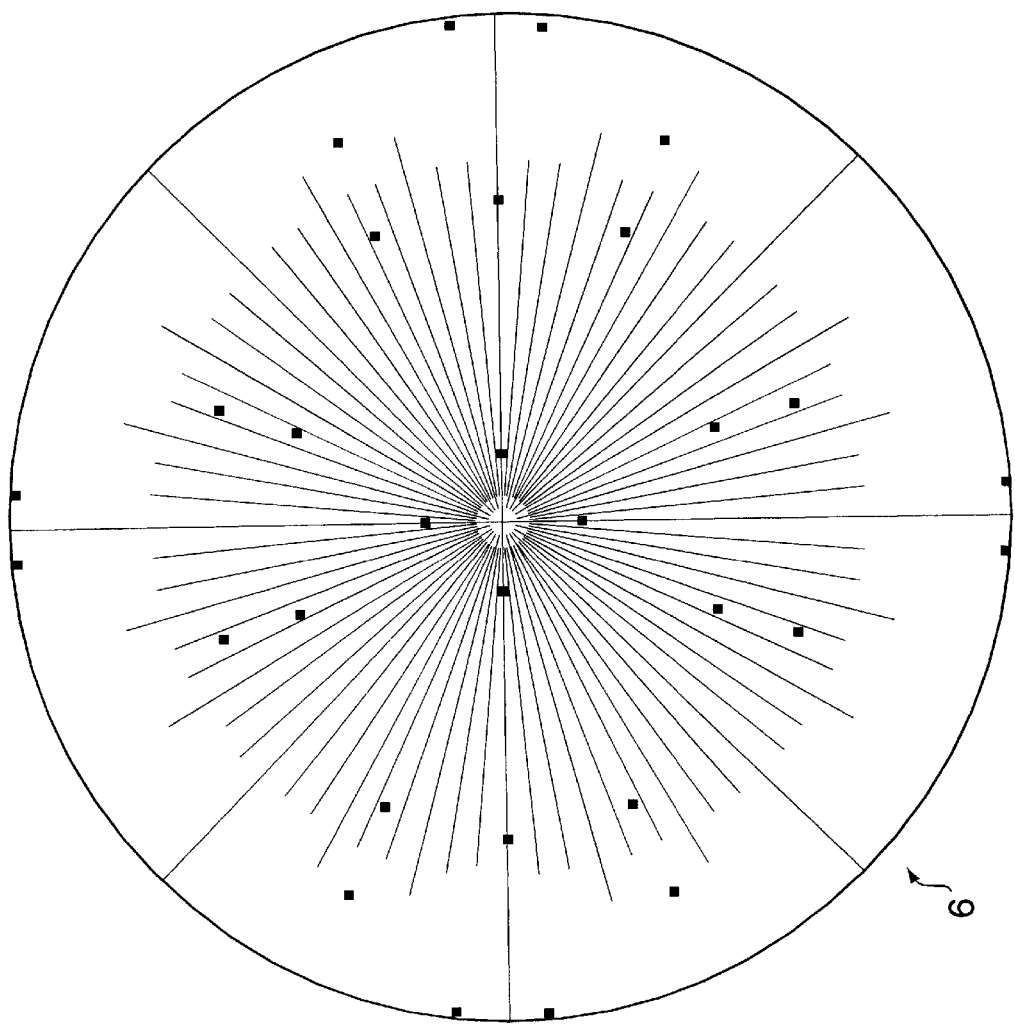
FIG. 1 shows an exemplary metal shim plate of the present invention.

According to the present invention, a method and apparatus for modifying the uniformity of a magnetic field formed by a magnet assembly are described. The following description uses the example of modification of the main magnetic field created by an MRI magnet assembly. However, the present invention is applicable to any modification of a magnetic field created by a magnet or magnet assembly, including applications where the intent is to make the field less uniform. Thus, the examples described herein are not intended to limit the scope of the invention to any particular intended use or result.

According to the method of the present invention, the field of the magnet assembly is mapped, that is, measured, to determine the extent of the nonhomogeneity. The measured field is analyzed and modeled by expanding the measurement data in an orthogonal basis set, for example, by using spherical harmonics of Legendre polynomials. By analyzing the Legendre polynomial expansion of the mapped field data, it can be determined whether the cause of the nonhomogeneity in the field is the magnitudes of particular terms of the expansion. The Legendre polynomial expansion that describes the field is of the form:

$rP(1,0)$, $rP(1,1)\cos(\phi)$, $rP(1,1)\sin(\phi)$
$r^2P(2,0)$, $r^2P(2,1)\cos(\phi)$, $r^2P(2,1)\sin(\phi)$, $r^2P(2,2)\cos(2\phi)$, $r^2P(2,2)\sin(2\phi)$
$r^3P(3,0)$ etc.
$r^4P(4,0)$ etc.
.
.
.
$r^nP(n,0)$ etc., where r is the distance of a point from the center of the magnet, P is an associated Legendre polynomial, and $\phi$ is the azimuthal angle.

The number n of Legendre terms in the expansion which are to be considered and compensated for will depend on the acceptable tolerance for non-uniformity in the field produced by the magnet. For example, in some cases, analyzing the mapped field data and providing compensation based on n=4 terms of the Legendre expansion may produce results within an accepted range for a particular application. On the other hand, in some applications it may be required to model the mapped data in an expansion based on n=10 polynomial terms, to achieve a higher degree of field uniformity.

According to the present invention, the magnet, which may be, for example, an iron core magnet, or a superconductor magnet, is shimmed by placing metal elements having specified physical dimensions and permeability $\mu$ on the pole faces of the magnet, or by subtracting metal elements from the pole face by, for example, machining grooves of the same dimensions, to increase or decrease the magnitudes of particular terms of the polynomial expansion. Each of these magnitude changes is created with metal elements, substantially independently of any higher order terms of the same symmetry. To create such an almost pure term, the location of the elements on the pole faces, the number of elements, and the physical dimensions of the elements, are determined experimentally. It has been found that rings of metal or arcuate segments may be used advantageously as shim elements in the present invention.

For example, to modify the magnitude of the term $r^2P(2,0)$, an element consisting of a full ring of metal, preferably steel, is placed on each pole. To increase the magnitude of the term $-r^2P(2,0)$, an element consisting of a complete groove is made on each pole. The radius r of the ring is a function of the magnet gap. Likewise, to increase the magnitude of the term $r^2P(2,1)\cos(\phi)$, a steel arc segment of 90 degrees is placed on each pole at diametrically opposite locations, or a groove is made in those locations if a negative sign is required. Similarly, to increase the magnitude of the term $r^3P(3,0)$, a complete ring of metal, preferably steel, is placed on one pole and a complete groove is made in the other pole. Again, the radius r depends on the magnet gap. To illustrate, for a magnet assembly having a 28 inch gap, the radius r of the metal ring is 10.20 inches. In general, for terms having even symmetry (that is, the radius term has an even exponent: $r^2$, $r^4$, $r^6$, etc.), a steel ring or groove is required, but not both. However, for terms having odd symmetry (that is, the radius term has an odd exponent: $r$, $r^3$, $r^5$, etc.), both a steel ring and a groove in the diametrically opposite location along the axis of symmetry are required.

In practice, the effect of each metal shim ring or arc segment is mapped at closely spaced radii, and the terms of interest are plotted to reveal the optimum location. If a negative sign is required, grooves may be machined in the magnet instead, to effect a decrease in magnitude of the unwanted corresponding term. If the magnet is to remain unmodified, an attachment to the magnet poles may be modified instead, as described below.

Finally, the magnitude of each term is determined, as a percentage of an input correction coefficient of the associated term, by an exact solution of a system of x equations in x unknowns, where x is the number of pure terms created by the procedure outlined above. Alternatively, the magnitudes can be determined by a least squares fit, if the number of terms for which the magnitude is increased is less than the number of terms for which the magnitude is to be decreased.

Figure 3:
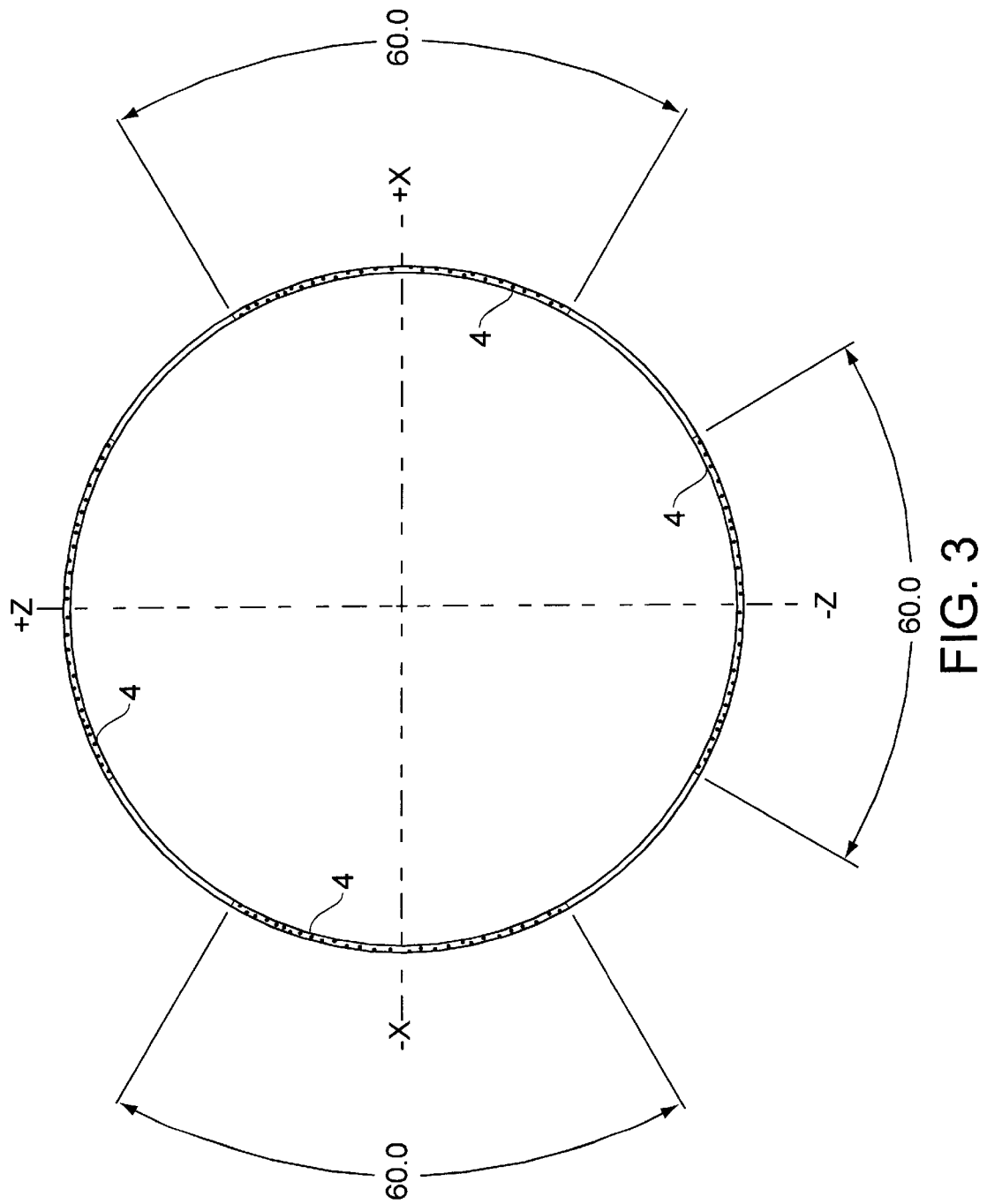
FIG. 3 shows exemplary metal shim elements for the shim plate of the present invention.

Once the magnitudes of each term have been calculated, the degree of homogeneity required for the particular application is satisfied in one of four ways. First, the mass of each metal element ring or arc may be adjusted by varying the thickness and/or width. Second, portions of the metal arcs may be symmetrically eliminated, effectively trans forming a full ring of metal into an assembly of arc segments 4, as shown in FIG. 3 for example. Third, metal of a different magnetic permeability $\mu$ may be used to shim, whereby the magnitude of the effect of the ferromagnetic material can be variable for a constant amount of shim material. Fourth, using the concept of employing ferromagnetic materials with different magnetic permiabilities $\mu$, one can generalize to the construction of an entire pole.

Figure 2:
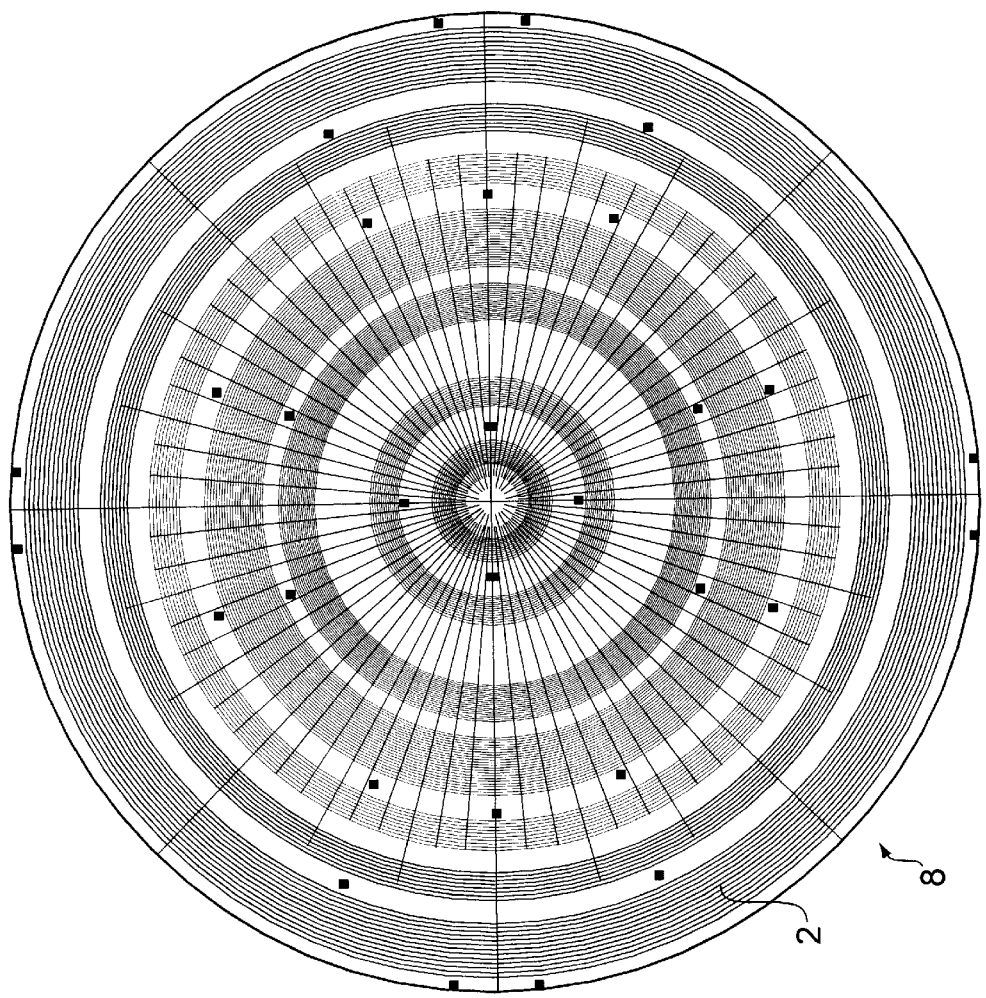
FIG. 2 shows an exemplary non-metal shim plate of the present invention.

Once the arc segments and complete rings have been designed, they must be applied to the magnet in some manner. A preferred embodiment of the present invention includes an apparatus which can be used to attach the shim elements to the magnet. The apparatus consists of two plates for each pole. Exemplary plates (6) and (8) are shown in FIGS. 1 and 2, respectively. As shown, plate (6) is a metal plate having a permeability $\mu$, which is affixed, preferably bolted, onto the magnet pole. Initially the plate is flat and is part of the magnet assembly. This plate will accommodate both the shim elements and the grooves, so that the magnet itself does not have to be modified. Plate (8), as shown, may be a plastic sheet of, for example, PVC. This plate bears a set of closely spaced grooves 2, machined on it, to tightly and securely hold the metal arc shim elements. The grooves 2 are formed in all locations where positive shim elements may be added to the magnet. The plastic plate (8) is affixed, preferably bolted, onto the metal plate (6), with the side of the plastic plate (8) holding the arcs facing the side of the metal plate (6) having the grooves, as shown at 10 in FIGS. 4(a) and 4(b). Alternatively, only the plastic sheet plate (8) may be used to hold the shim elements in place against the magnet, if only positive Legendre terms are modified or if grooves are machined directly into the magnet. In another alternative embodiment, the metal plate 6 may be replaced by an additional non-metal plate 8. Again, the suitability of this embodiment depends on the Legendre terms to be modified for the particular embodiment, and may or may not require having grooves machined into the magnet. In many cases, this embodiment would be preferable to that in which both plates (6) and (8) are used.

In a preferred embodiment of the present invention, the thickness of each plate is 0.25 inches. The width of the grooves, for both the metal and plastic plates, is preferably 0.062 inches and 0.125 inches. The depth is different for each set of grooves in the metal plate (6), depending on the amount of metal required to cancel the corresponding term.

The present invention has been described by way of example and in terms of preferred embodiments. However, it is to be understood that the present invention is not strictly limited to the disclosed embodiments. To the contrary, various modifications, as well as similar arrangements, are included within the spirit and scope of the present invention. The scope of the appended claims, therefore, should be accorded the broadest possible interpretation so as to encompass all such modifications and similar arrangements.

What is claimed is:

1. A method for passively shimming a magnet, comprising:

measuring a magnetic field produced within a predetermined volume by the magnet;

modeling the measured magnetic field in the form of a polynomial expansion having a predetermined number of harmonic terms;

detecting the degree of homogeneity in the measured field within the predetermined volume by examining the harmonic terms;

determining which harmonic term of the polynomial expansion should be modified in order to change the homogeneity detected in the measured field; and coupling a metal element which provides the determined harmonic term modification to the magnet.

2. The method of claim 1, wherein:

measuring the magnetic field includes producing magnetic field data, and modeling the measured magnetic field includes analyzing the magnetic field data and describing the analyzed data as a polynomial expansion having a predetermined number of harmonic terms.

3. The method of claim 1, wherein the polynomial expansion is a Legendre expansion.

4. The method of claim 1, wherein the metal element is a shim.

5. The method of claim 4, further comprising coupling the shim to a pole of the magnet assembly.

6. The method of claim 5, wherein the shim is a metal ring.

7. The method of claim 5, wherein the shim is an arcuate metal element.

8. The method of claim 4, further comprising attaching a non-metallic cover plate to the magnet, wherein the cover plate includes grooved portions for holding the shim in place in a predetermined location with respect to the pole of the magnet assembly.

9. The method of claim 8, wherein the grooved portion has a width of about 0.062 inches.

10. The method of claim 8, wherein the grooved portion has a width of about 0.125 inches.

11. The method of claim 8, further comprising disposing a metal plate such that the metal plate affects the magnetic field produced by the magnet, and such that the shim is held in the predetermined location between the metal plate and the cover plate.

12. The method of claim 11, wherein the cover plate and the metal plate each have a thickness of about 0.25 inches.

13. The method of claim 8, wherein the non-metallic cover plate is a first non-metallic cover plate, and further comprising disposing a second non-metallic cover plate between the magnet and the first non-metallic cover plate, such that the shim is held in the predetermined location between the first and second non-metallic cover plates.

14. The method of claim 1, further comprising removing a portion of the magnet corresponding to the metal element in order to modify the determined harmonic term.

15. The method of claim 14, wherein the removed portion is a groove.

16. The method of claim 15, wherein the groove has a width of about 0.062 inches.

17. The method of claim 15, wherein the groove has a width of about 0.125 inches.

18. The method of claim 11, further comprising removing a portion of the metal plate corresponding to the metal element in order to modify the determined harmonic term.

19. The method of claim 18, wherein the removed portion is a groove.

20. The method of claim 19, wherein the groove has a width of about 0.062 inches.

21. The method of claim 19, wherein the groove has a width of about 0.125 inches.

* * * * *

UNITED STATES PATENT AND TRADEMARK OFFICE
CERTIFICATE OF CORRECTION

PATENT NO. : 5,992,006
DATED : November 30, 1999
INVENTOR(S) : Thomas DATSIKAS

It is certified that error appears in the above-identified patent and that said Letters Patent is hereby corrected as shown below:

IN THE TITLE:

Change "HEMOGENEITY" to --HOMOGENEITY--.

Signed and Sealed this

Twenty-fourth Day of April, 2001

Attest:

NICHOLAS P. GODICI

Attesting Officer        Acting Director of the United States Patent and Trademark Office